(12) United States Patent
Forbes et al.

(10) Patent No.: US 8,513,102 B2
(45) Date of Patent: Aug. 20, 2013

(54) REDUCTION OF RANDOM TELEGRAPH SIGNAL (RTS) AND 1/F NOISE IN SILICON MOS DEVICES, CIRCUITS, AND SENSORS

(76) Inventors: Leonard Forbes, Corvallis, OR (US); Drake A. Miller, Tigard, OR (US)

( * ) Notice: Subject to any disclaimer, the term of this patent is extended or adjusted under 35 U.S.C. 154(b) by 0 days.

(21) Appl. No.: 13/317,522

(22) Filed: Oct. 20, 2011

(65) Prior Publication Data
US 2012/0112251 A1 May 10, 2012

Related U.S. Application Data

(60) Provisional application No. 61/411,376, filed on Nov. 8, 2010.

(51) Int. Cl.
*H01L 21/425* (2006.01)
*H01L 21/336* (2006.01)

(52) U.S. Cl.
USPC .................. 438/514; 257/E21.409; 257/288

(58) Field of Classification Search
USPC .......... 257/288, E21.409, E29.255; 438/292, 438/514
See application file for complete search history.

(56) References Cited

U.S. PATENT DOCUMENTS

| | | | |
|---|---|---|---|
| 6,104,068 | A | 8/2000 | Forbes |
| 6,355,961 | B1 | 3/2002 | Forbes |
| 6,413,825 | B1 | 7/2002 | Forbes |
| 7,214,575 | B2 | 5/2007 | Rhodes |
| 7,348,642 | B2 | 3/2008 | Nowak |
| 7,651,920 | B2 * | 1/2010 | Siprak .......................... 438/372 |
| 2009/0067251 | A1 * | 3/2009 | Sarin et al. ............... 365/185.19 |
| 2009/0289282 | A1 * | 11/2009 | Tsuno ........................... 257/219 |

OTHER PUBLICATIONS

Chao Shen; Chen Xu; Weiquan; Huang, W.R.; Mansun Chan; "Low voltage CMOS active pixel sensor design methodology with device scaling considerations," Proceedings IEEE Electron Devices Meeting, Hong Kong, Jun. 30, 2001, pp. 21-24.
Min-Hwa Chi; Technologies for high performance CMOS active, Proceedings 5th International Conference on Solid-State and Integrated Circuit Technology, Oct. 21-23, 1998, pp. 180-183.
Drake A. Miller, Panupat Poocharoen and Leonard Forbes, "1/f noise and RTS(random telegraph signal) errors in sense amplifiers," IEEE Workshop on Microelectronics and Electron Devices, Boise, Apr. 20, 2007, pp. 22-22.
L. Forbes, D.A. Miller and P. Poocharoen, "1/f Noise and RTS(Random Telegraph Signal) Errors in Comparators and Sense Amplifiers," NanoTech, Santa Clara CA, 2007, vol. 1 pp. 197-200.
Drake A. Miller, Panupat Poocharoen and Leonard Forbes, "Sub-threshold leakage due to 1/f noise and RTS(random telegraph signals)," IEEE Workshop on Microelectronics and Electron Devices, Boise, Apr. 20, 2007, pp. 23-24.
Slavcheva G. et al., "Potential Fluctuations in metal-oxide-semiconductor field-effect transistors generated by randomly distributed impurities in the depletion layer," J. Appl. Phys., vol. 91, No. 7, pp. 4326-4324, 2002.

(Continued)

*Primary Examiner* — William D Coleman
*Assistant Examiner* — Christine Enad

(57) ABSTRACT

The effects of random telegraph noise signal (RTS) or equivalently 1/f noise on MOS devices, circuits, and sensors is described. Techniques are disclosed for minimizing this RTS and low frequency noise by minimizing the number of ionized impurity atoms in the wafer, substrate, well, pillar, or fin behind the channel of the MOS transistors. This noise reduction serves to reduce the errors in devices, sensors, and analog integrated circuits and error rates in digital integrated circuits and memories.

20 Claims, 6 Drawing Sheets

(56) References Cited

OTHER PUBLICATIONS

L. Forbes, D.A. Miller and M.Y. Louie, "1/f Noise and RTS(Random Telegraph Signals) and Read Errors in Nanoscale Memories," NanoTech, Santa Clara CA, 2007, vol. 1, pp. 156-159.

L. Forbes, D.A. Miller and M.Y. Louie, "Single Election Trapping in Nanoscale Transistors; RTS(Random Telegraph Signals) and 1/f Noise," NanoTech, Santa Clara CA, 2007, vol. 4, pp. 569-562.

L. Forbes and D.A. Miller, "A percolation model for Random Telegraph Signals in Metal-Oxide-Silicon Field Effect Transistor drain current and threshold voltage distributions," Appl. Phys. Lett., vol. 93, No. 4, pp. 043517-1-043517-3 , Jul. 28, 2008.

D.A. Miller, M.E. Jacob, and L. Forbes, "Compact Model of Low-Frequency Noise in Nanoscale Metal-Oxide-Semiconductor Field Effect Transistors," Technical Proceedings of the Nanotechnology Conference and Trade Show, vol. 3, Workshop on Compact Modeling, pp. 632-635, 2009.

L. Forbes and D.A. Miller,"Characterization of Single Electon Effects in Nanoscale MOSFETs," Proc. SPIE, vol. 7402, pp. 740201-1 to 740201-8, 2009.

D. C. Murray, J. C. Carter, and A. G. R. Evans, "CMOS 1/f Noise: n-Channel Versus p-Channel," Appl.. Phys. A, vol. 51, pp. 337-339,1990.

\* cited by examiner

REDUCTION OF RANDOM TELEGRAPH SIGNAL (RTS) AND 1/F NOISE IN SILICON MOS DEVICES, CIRCUITS, AND SENSORS

PRIORITY DATA

This application claims the benefit of U.S. Provisional Patent Application Ser. No. 61/411,376, filed on Nov. 8, 2010, and which is incorporated herein by reference.

TECHNICAL FIELD

This application relates to the effect of random telegraph signal (RTS) noise or equivalently 1/f noise on MOS devices and circuits and more particularly to apparatus and methods for minimizing this low frequency noise in MOS devices.

BACKGROUND

Complementary Metal Oxide Semiconductor (CMOS) devices are widely used to form integrated circuits and sensors. Historically one of the principal problems to be overcome was the development of surface passivation techniques to reduce the number of surface states for electrons at the silicon oxide interface. These surface states resulted in variations in the threshold voltage and large values of low frequency or 1/f noise. N-channel transistors, where the carriers in the surface channel of the transistor are electrons, were particularly problematic and always had more low frequency noise than p-channel devices. Surface passivation techniques were developed and micrometer, μm, size transistors, where the conduction can be considered to be a sheet of charge, gained wide acceptance. The terms micrometer size, or micrometer scale, devices refers to transistors in which the length and width of a top view of the conduction channel has dimensions of micrometers, μm. Sub-micron devices have dimensions less than micrometers, or dimensions of nanometers, nm. In nanometer dimension, or nanoscale devices, however, as device dimensions begin to approach atomic dimensions, size effects become important and the location of individual electronic charges in the devices become important. This is particularly important in CMOS image sensors that can be used to detect only a few photoelectrons. MOS or CMOS image sensors are widely used in digital cameras and cell phone cameras.

The use of transistors with lower threshold voltages is known to improve the output voltage swing and the overdrive, $V_{GS}-V_T$, of MOS transistors. Improving the overdrive, $V_{GS}$ (gate to source voltage)-$V_T$ (turn-on or threshold voltage), improves the speed and the performance of MOS transistors in either analog or digital integrated circuits. In particular some techniques for fabricating lower threshold transistors and improving the output voltage swing range have been described for image sensors and their applications.

Image Sensors

Chao Shen; Chen Xu; Weiquan; Huang, W. R.; Mansun Chan; "Low voltage CMOS active pixel sensor design methodology with device scaling considerations," Proceedings Electron Devices Meeting, IEEE Hong Kong 30 Jun. 2001, pp. 21-24 describes how higher threshold voltage transistors impose significant limitations on CMOS APS imagers. This is shown in FIG. 1a, where the available input swing is only $V_{DD}-2V_T-V_{DS}$ M4. The pixel shown in, 101, is known as a 3T or three transistor pixel, where M1, M2 and M3 are the three transistors of the pixel and M4 is the sense transistor and is common to many pixels. The photodiode 115 is arranged as shown. $V_{DD}$ is the positive DC power supply voltage and 107 shows the effective input voltages to transistor M2 and output voltage or voltage at the source of transistor M2. The effective input to the voltage of transistor M2 is shown in 105, the input voltage to M2 cannot rise higher than $V_{DD}$ minus the threshold or turn on voltage of $M_1$, $V_TM1$. If the input voltage to transistor M2 falls below the threshold voltage of transistor M2, $V_TM2$, plus the drain to source voltage of transistor M4, $V_{DS}M4$, then transistor M2 cannot turn on. The output voltages are shown in 106 where the output voltage cannot be higher than $V_{DD}$ minus the threshold voltage of transistor $M_1$, $V_TM1$, minus the threshold voltage of transistor M2, $V_TM2$. The output voltage cannot fall below the drain to source voltage of transistor M4, $V_{DS}M4$. This arrangement significantly limits the dynamic range of a CMOS active pixel sensor (APS) output in an imager pixel circuit as shown in FIG. 1a. Similar considerations however apply to the more commonly employed 4T pixel arrangement 110 shown in FIG. 1b, which employs an added transistor as a transfer device 112. U.S. Pat. No. 7,214,575 describes techniques for making some transistors with lower threshold voltages or a transistor of a pixel cell for use in a CMOS imager with a lower threshold voltage and multiple $V_T$ transistors as part of active pixel cells of a CMOS imager or a CCD imager. A transistor of a pixel cell for use in a CMOS imager with a low threshold voltage of about 0.3 V to less than about 0.7 V was disclosed. The transistor is provided with conventional high dosage source and drain regions around the gate electrode and with conventional halo implanted regions around the drain to prevent punch through. The conventional lightly doped LDD regions and/or the enhancement implanted regions omitted from at least one side of the gate electrode. The low threshold transistor is electrically connected to a high voltage transistor with a high threshold voltage of about 0.7 V. Min-Hwa Chi describes "Technologies for high performance CMOS active pixel imaging system-on-a-chip," in the Proceedings 5th International Conference, 21-23 Oct. 1998, pp. 180-183. Low $V_T$ or depletion mode transistors are needed in the pixel transistors and column sense amplifier, for a larger range of voltage in analog circuits. None of these however describe or propose the use of lower threshold voltage, $V_T$, transistors for reduced noise.

The trapping and release of electrons in the gate insulator of MOS devices can result in changes in the threshold voltage and drain current of conventional micrometer size transistors. These changes result in RTS or 1/f noise in the transistor. These changes in drain current are described by a conventional model for micrometer scale devices, where there is a uniform sheet of charge and average change in the overall threshold voltage. For instance for a 0.35 μm by 0.35 μm transistor where the gate oxide is 66 Å, or 6.6 nm, thick, the fluctuation of a single electronic charge would contribute about 0.3 mV to the threshold voltage and the average change in drain current would be only about 0.03%. These values are much smaller than those predicted by the atomistic model, described later, for sub-nanometer dimension transistors. RTS and 1/f noise become significant problems in nanometer dimension devices of sizes 1000 nm or less. In image sensors the noise of the source follower is critical in determining the ability to detect the minimal number of photoelectrons stored on the photodiode capacitance.

Sense Amplifiers and Comparators

If there are a large number of trapped electrons in the gate insulator there can, of course, be a simultaneous de-trapping or emission of several electrons at one time or, more importantly as will be shown later, conduction in percolation, or small river-like, channels. The probability that there will be a large change in threshold voltage causing an error has been found to be described by a lognormal distribution as described by Drake A. Miller, Panupat Poocharoen and Leonard Forbes, "1/f noise and RTS (random telegraph signal) errors in sense amplifiers," IEEE Workshop on Microelectronics and Electron Devices, Boise, Id., 20 Apr. 2007, pp. 22-22. In a lognormal distribution the probability of a large value is of the order exp(−x). The results in L. Forbes, D. A. Miller and P. Poocharoen, "1/f Noise and RTS (Random Telegraph Signal) Errors in Comparators and Sense Amplifiers," NanoTech, Santa Clara Calif., 2007, vol. 1 pp. 197-200 show a 0.1% probability of a value twenty times the minimal RTS step of 10 mV on a minimum size device in a 90 nm technology with 9 nm gate oxides. This would be 200 mV, corresponding to an apparent fifty traps changing charge state. In reality the large change in drain current is not due to fifty traps changing charge state but rather modulation of conduction in percolation channels as described later in our model for nanometer dimension transistors or transistors with sub-micron dimensions. For a sense amplifier in 50 nm technology with 2 nm gate oxides and a transistor width to length size of W/L=2.5 µm/0.5 µm, this translates into a threshold voltage distribution. If a DRAM sense amplifier is upset by such a threshold voltage mismatch of $\Delta V_T$=200 mV, then the error rate can be calculated.

Nanoscale Memory Circuits

L. Forbes, D. A. Miller and M. Y. Louie, "1/f Noise and RTS (Random Telegraph Signals) and Read Errors in Nanoscale Memories," NanoTech, Santa Clara Calif., 2007, vol. 1, pp. 156-159 describes the problem of detecting the small number of electrons stored in nanoscale memories. The minimum number of electrons that can be detected is limited or increases with (a) the magnitude of the 1/f noise and (b) as the lower bandwidth decreases or time differences between read signals increases. This determines the minimum number of electrons in a single memory element that can be detected. If one electron is stored, $\Delta Nt=1$, then the time until there is an error can be calculated as the time to failure, $t_f$, where $t_f$ is determined by the lower bandwidth. $\Delta Nt=1$ describes the single electron being stored, or number of electrons being stored. For a single memory element or cell this can be a very long time. Practical memories, however, have a very large number of individual elements or bits, N, typically a gigabit. N is the number of elements or cells storing electrons. Practical memories require very low bit error rates. If the failure rate is constant, $t_f$ is the same for all bits, and if there are N=1G bits then for a nanoscale memory the bit error rate will be around $10^{-6}$/sec or there will be many more than one bit error per year, since one year is over $10^7$ seconds. This is higher than the desired rate of one bit error per year. However these error rates are much smaller than those predicted by our model described later for nanometer dimension transistors, or transistors with sub-micron dimensions. RTS and 1/f noise become significant problems in nanometer dimension devices of sizes 1000 nm or less.

Analog Integrated Circuits

Like nanoscale memories, CMOS analog integrated circuits work on the basis of charge store on capacitive nodes. The gain of a switched capacitor amplifier for instance depends on the ratios of two charges, charge is first stored on an input capacitor and then this charge is tranferred to a feedback capacitor. Low frequency or RTS noise will introduce an added uncertainty, or noise, into the output voltage and there will be a significant error in the output voltage. However the noise calculated by conventional models is much smaller than those predicted by the atomistic model for sub-nanometer dimension transistors. RTS and 1/f noise become significant problems in nanometer dimension devices of sizes 100 nm or less. In nanoscale devices this noise can be larger than the normal thermal noise or noise associated with the resistance of the channel. RTS noise is an important limitation in nanoscale analog integrated circuits.

Digital Integrated Circuits

Digital CMOS circuits depend upon one transistor being turned off, for instance the NMOS channel transistor in an inverter while the other complementary transistor, a PMOS, is turned on. This will yield a high voltage or positive logic one signal at the output. In the case of nanoscale transistors there is a finite probability that multiple electrons might be emitted as RTS noise and escape from the gate insulator in the NMOS transistor resulting in sub-threshold conduction as described by Drake A. Miller, Panupat Poocharoen and Leonard Forbes, "Subthreshold leakage due to 1/f noise and RTS (random telegraph signals)," IEEE Workshop on Microelectronics and Electron Devices, Boise, Id., 20 Apr. 2007, pp. 23-24. Such sub-threshold conduction can upset the output voltage in static logic CMOS circuits. In dynamic CMOS integrated circuits sub-threshold conduction is particularly detrimental since it can easily discharge capacitive nodes resulting in logic errors. Again these error rates are much smaller than those predicted by our model described later for nanometer dimension transistors, or sub-micron transitors. RTS and 1/f noise become significant problems in nanometer dimension devices of sizes 1000 nm or less.

Noise

Low-frequency noise in metal-oxide semiconductor devices is generally categorized into two groups: 1/f and random telegraph noise (RTN). In the first case a measurement of the noise results in a noise power spectrum that has a 1/f slope that continues to low frequencies. RTN on the other hand has a different character as compared to 1/f. RTN appears with a Lorentzian-shaped noise spectrum with a low frequency plateau and a roll off of $1/f^m$ with m=2. The fundamental noise mechanism behind the low-frequency noise in metal-oxide-semiconductor structures is theorized to be the interaction of surface charge with slow traps in the oxide near the interface. These interface traps have a sufficient spread in energy such that the summation of these traps spans many decades of time constants and could account for a 1/f slope spanning many decades of frequency.

Deep levels in semiconductors are capable of causing a fluctuation in the generation, recombination, and trapping rates of charge which results in a fluctuation of the charge density. This fluctuation is detected as a change in conductivity and sensed either as a current or voltage. This type of fluctuation is called Generation-Recombination (GR) noise. This type of noise is found in the channel of JFET's, photoconductors, and semiconductor resistors. For the energy level to act as a GR noise source the characteristic energy must be relatively deep in the band gap of the semiconductor.

RTS noise has a similar power spectrum in most respects to GR noise. RTS has also been named burst or popcorn noise and fundamentally does not differ as to the origin of the noise except that RTS is considered a fundamental phenomenon while burst noise was most often associated with poor device quality. It is pretty well accepted now that the behavior of RTS is due to the capture and emission of traps near a current carrying region where the field set up by the trapped charge causes a change in the local conductivity and/or mobility. RTS has been categorized with 1/f noise since a 1/f spectrum can be generated from the random capture and emission of several fluctuating traps.

P-channel transistors have been observed to have less noise and in comparisons for large devices, for example those devices having a width-to-length, W/L, =100 µm/32 µm. D.

C. Murray, J. C. Carter, and A. G. R. Evans, "CMOS 1/f Noise: n-Channel Versus p-Channel," Appl. Phys. A, vol. 51, pp. 337-339, 1990 noticed that p-channel transistors have less noise than n-channel transistors at comparable drain current. Further, D. C. Murray, J. C. Carter, and A. G. R. Evans, "CMOS 1/f Noise: n-Channel Versus p-Channel," Appl. Phys. A, vol. 51, pp. 337-339, 1990 observed that counter-doping of p-channel devices by ion implantation would result in a lower noise.

RTS noise in MOS devices has provided an interesting tool for studying the behavior of traps and poses interesting engineering challenges. It is well established now that RTS in MOS devices is the result of the capture and emission of minority charge carriers in the gate oxide of the device. There has been extensive work in modeling and understanding the mechanisms at play. The action and behavior of traps is well understood, so much of the modeling has revolved around understanding the large modulation of the current that is observed in the measurements. In general the behavior or capture and emission rates of traps are taken from considering Shockley-Reed-Hall (SRH) statistics and assuming a tunneling capture mechanism.

One of several approaches taken to model the RTS amplitudes is the model assuming a cored-out area of low conductivity due to the trapped charge reduces the carrier number in the channel by an amount equal to this reduced device area. In this approach the field setup by the trapped charge creates an exclusion zone depending on the depth of the trap into the oxide and the level of inversion charge in the channel. This exclusion zone causes the conduction current to flow in small separated river like or percolation channels rather than a sheet of charge. Variations in potential near the source terminal of the transistor have been described by G. Slavcheva et al., "Potential Fluctuations in metal-oxide-semiconductor field-effect transistors generated by randomly distributed impurities in the depletion layer," J. Appl. Phys., vol. 91, no. 7, pp. 4326-4324, 2002; L. Forbes, D. A. Miller and M. Y. Louie, "Single Election Trapping in Nanoscale Transistors; RTS (Random Telegraph Signals) and 1/f Noise," NanoTech, Santa Clara Calif., 2007, vol. 4, pp. 569-562; and L. Forbes and D. A. Miller, "A percolation model for Random Telegraph Signals in Metal-Oxide-Silicon Field Effect Transistor drain current and threshold voltage distributions," Appl. Phys. Lett., vol. 93, no. 4, pp. 043517-1-3, 28 Jul. 2008.

Phase Noise in RF and Microwave Circuits

It is well known that low frequency 1/f noise (or equivalently RTS noise) results in phase noise in RF, radio frequency, and microwave circuits and specifically CMOS RF circuits. Phase noise in a CMOS voltage controlled oscillator, VCO, results in not a single frequency but a broad band of frequencies. This results in inefficient use of the radio frequency spectrum since a single signal now occupies a band of frequencies not a single frequency.

Effect of RTS and Low Frequency Noise on Integrated Circuits

Models that describe the conduction of electrons in percolation channels have been described by D. A. Miller, M. E. Jacob, L. Forbes, "Compact Model of Low—Frequency Noise in Nanoscale Metal-Oxide-Semiconductor Field Effect Transistors," Technical Proceedings of the Nanotechnology Conference and Trade Show, vol. 3, Workshop on Compact Modeling, pp. 632-635, 2009, and L. Forbes and D. A. Miller, "Characterization of Single Electron Effects in Nanoscale MOSFET's," Proc. SPIE, vol. 7402, pp. 740201-1 to -8, 2009.

As a result of the aforementioned reasons or as a consequence thereof, there is a need to minimize RTS noise in both analog and digital MOS and CMOS integrated circuits and RF circuits. A model that utilizes the concept of a uniform sheet of charge in the channel of a MOSFET, such as conventionally used for micrometer, or micron, devices, does not predict the noise performance of nanoscale devices well. In that the prediction cannot adequately reflect the noise performance seen in practice for very small devices, improvements in performance are not easily envisioned. Accordingly, an improvement in the noise model of MOSFET devices can lead to structure changes in construction and operation of such devices. This becomes more important as device dimensions decrease and with the application of nanoscale dimension devices.

SUMMARY

An active silicon MOS field effect device, defined on a substrate having a width dimension equal to or less than 350 nm and a length dimension equal to or less than 350 nm, has a conduction channel behind the gate electrode doped to an ionized dopant atom concentration in the range of between $10^{13}$ to $10^{15}$ atoms per cubic centimeter to reduce the random telegraph signal (RTS) and 1/f noise in the device.

DETAILED DESCRIPTION

Figure 1A:
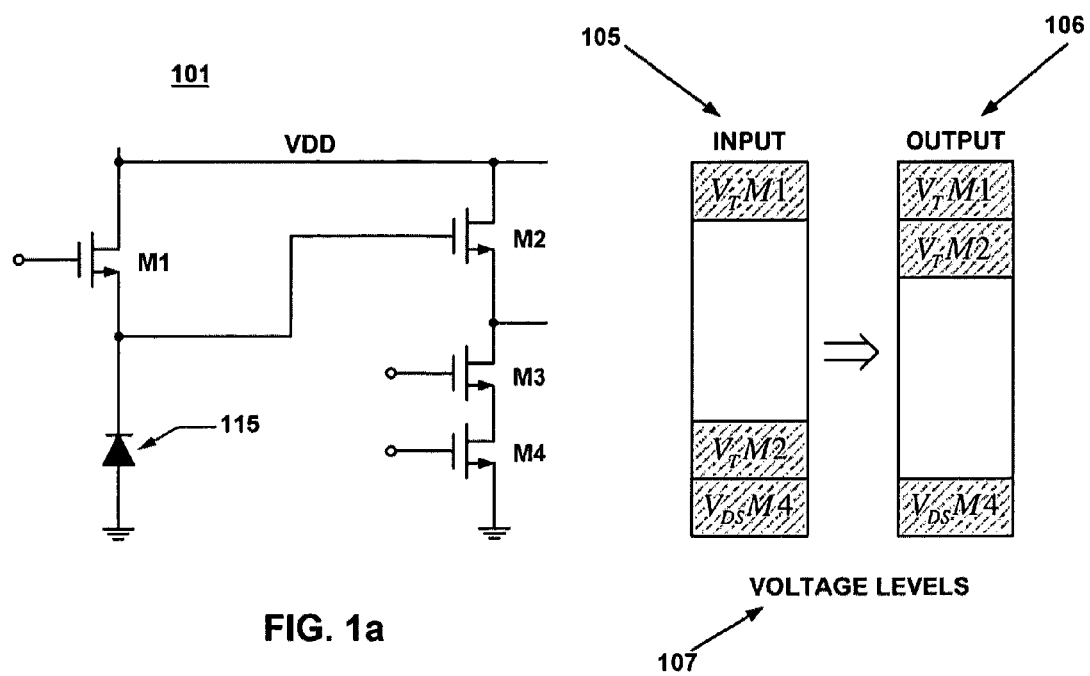
FIG. 1a is a schematic that illustrates a three transistor (3T) active pixel sensor (APS) circuit and the voltage swing (clear area) allowed at the input and output of the second circuit stage.
Figure 1B:
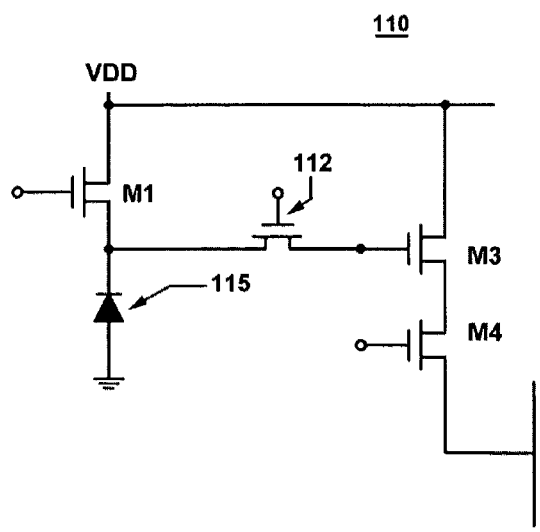
FIG. 1b is a schematic that illustrates a commonly used four transistor (4T) active pixel sensor circuit (APS).
Figure 2A:
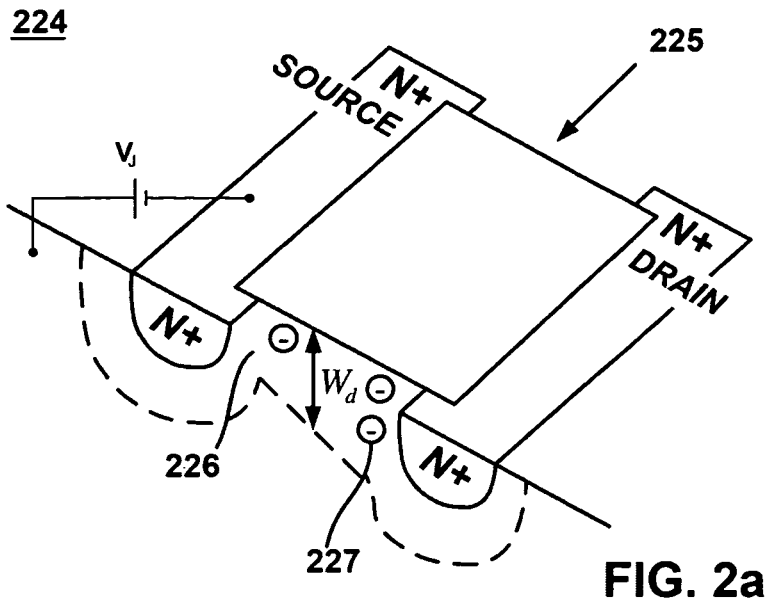
FIG. 2a is a perspective diagram of a field effect transistor that shows an n-channel MOS or CMOS transistor with ionized impurity dopants in the depletion region.

It is well known in nanoscale CMOS transistors (i.e., transistors having dimensions on a substrate of 350 nm by 350 nm or less) that dopant atom number fluctuations can result in unacceptably large variations in the average threshold voltage. For instance if a 350 nm by 350 nm (0.35 μm by 0.35 μm) transistor 224, as shown in FIG. 2a, has a substrate, or well, doping of $10^{17}/cm^3$ there will be about 1000 acceptor dopant atoms 227 in the depletion region 226 behind the channel 225. If the gate oxide is 66 Å or 6.6 nm thick then this bulk charge of dopant atoms will contribute about 0.3 volts to the threshold voltage. However, there can be a root mean square fluctuation in the number of atoms of about 36 atoms resulting in about a 3%, or 10 mV, variation in the average threshold voltage. As used herein, the term "behind the gate" means the region in the substrate behind or below the conduction channel from which the dopant atoms influence the electric charge in the conduction channel. The electric charge in the conduction channel is also determined by the gate voltage.

What was not well known until the time of the present invention is that on a nanoscale scale, or less than a 1000 nm scale, size effects can become important in determining the RTS or 1/f noise of CMOS transistors. For technical purposes, the nanoscale scale is the size at which the expected fluctuations of the averaged properties due to location of individual particles cannot be reduced to below some desirable threshold of a few percent. For dimensions less than 1000 nm, or atomic dimensions of 1000 Å, the locations of individual atoms and electronic charges become important and result in an apparent amplification of random telegraph signal, RTS, noise in nanoscale transistors currently being used in MOS and CMOS memory, logic, and imaging devices.

Figure 2B:
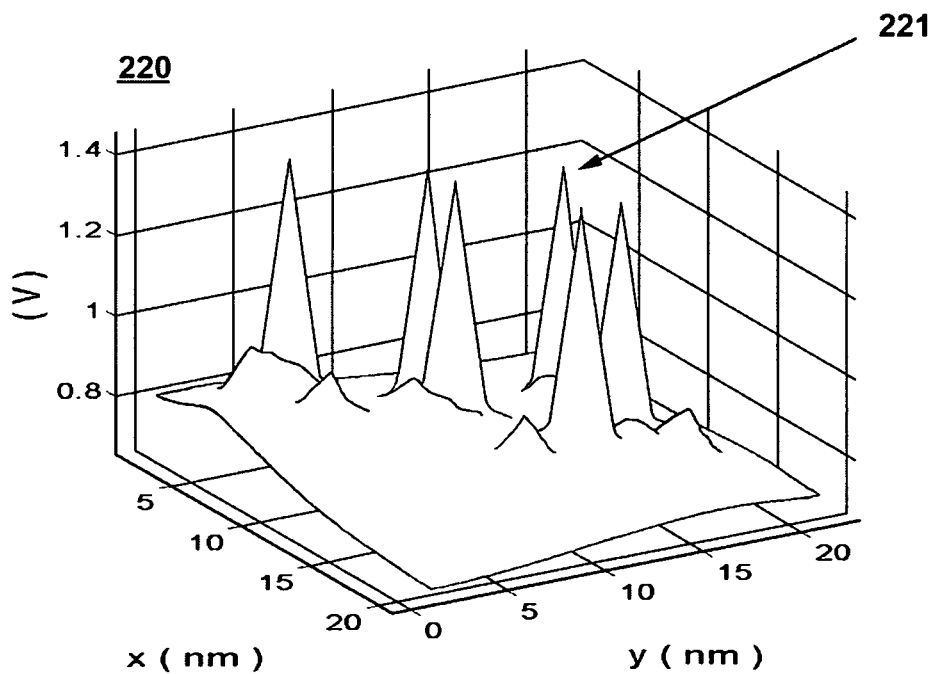
FIG. 2b is a three axis graph that illustrates the variations in potential in a transistor channel due to the presence of individual dopant atoms in the depletion region.
Figure 2C:
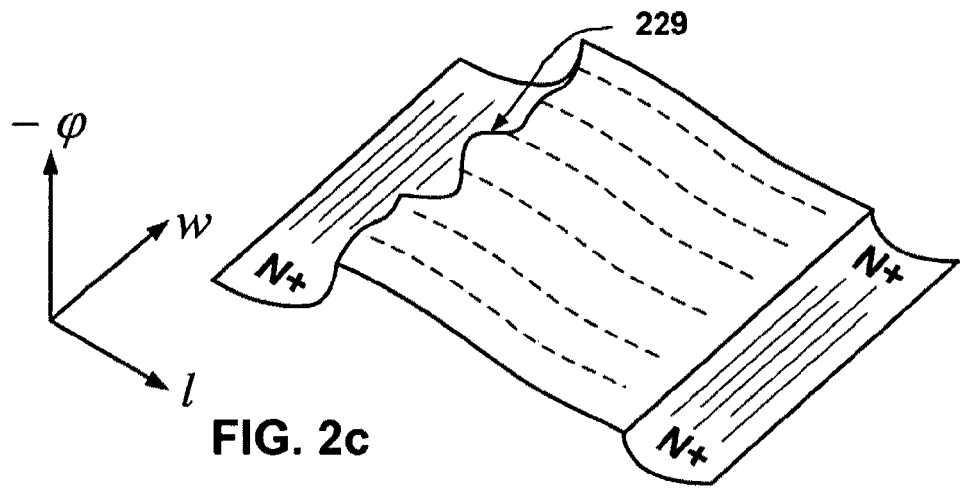
FIG. 2c is a three axis graph corresponding to the diagram of FIG. 2a, which shows the variation in potential in the channel of the transistor under the gate.

On an atomic scale it is the location and fluctuation of charge near the source of the transistor that is important in determining the details of the conduction mechanism. FIG. 2b shows a 3-dimensional illustration 220 of the localized potential variations 221 in part of the channel described by the two dimensional coordinates x,y of an NMOS transistor with $V_{GS}=0$ and $V_{DS}=0$ due to the random location of boron atoms in the substrate. These localized potential variations 221 have been described by others in the field for a nanoscale transistor 225. When gate bias and drain bias are applied, the depletion region 226 behind the gate forms with ionized acceptor 227 impurities, for example boron atoms. The potential also varies along the channel and the electrons are attracted to the lower electron potential state nearer the drain. FIG. 2c illustrates the potential, ϕ, variations 229 in the channel and particularly near the source with $V_{GS}$ and $V_{DS}$ applied. The potential near and along the edge of the source is not uniform on an atomic scale and there are significant potential variations near the source. The peaks illustrated in FIG. 2b represent regions where electrons cannot be injected from the source and the valleys represent regions where electrons can easily flow from the source into the channel. This topography will cause the electron flow in the channel to flow in ribbons or narrow percolation channels rather than as a sheet of charge.

FIG. 3 illustrates the N-channel CMOS transistor 224' with the percolation channels 310 defined. This N-channel CMOS transistor has a high well or substrate doping as in the above example of FIG. 2a with two different substrate-to-source junction bias conditions, $V_J=V_{GS}-V_T$, of 10 mV and 1.0V respectively. $V_{GS}$ is the gate to source voltage and $V_T$ is the average threshold voltage. Dopant fluctuations will cause variations in the threshold voltage near the source and will control conduction in the channel in localized regions. The threshold voltage near the source is most important in determining the conduction in the transistor when the transistor is operated in the saturation region. RTS noise due to trapping of single electrons near the source can also control conduction in the channel in localized regions.

The charge due to dopant atoms near the source is fixed and cannot change, however the charge associated with the trapping of electrons can fluctuate with trapping and emission of the electrons in the gate oxide or insulator. Thus the conduction in localized regions can be modulated by this electron trapping. The degree to which the conduction is modulated will also depend on the location of dopant atoms in the region adjacent to the electron traps in the oxide.

The percolation model to describe RTS and 1/f noise takes into account the effect of single atomistic electron charges or charges associated with single electrons. The separation of individual electrons in the channel will be determined by the total charge in the channel q=Co☐V☐$a^2$ where $V=V_{GS}-V_T$, Co is the gate insulator capacitance, and $a^2$ is the average area occupied by a single electron. This leads to an analysis of conduction in a CMOS transistor by considering channel partitions rather than an overall uniform average channel model consisting of a sheet of charge as in conventional models for micrometer or micron scale size devices.

Technique to Achieve Low Noise

Figure 3A:
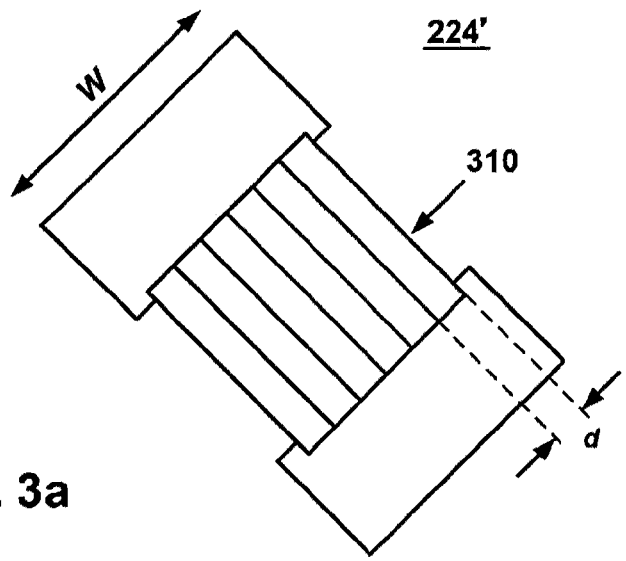
FIG. 3a is a plan view diagram of a field effect transistor that shows a model of the conduction channel divided into six discrete percolation channels.
Figure 3B:
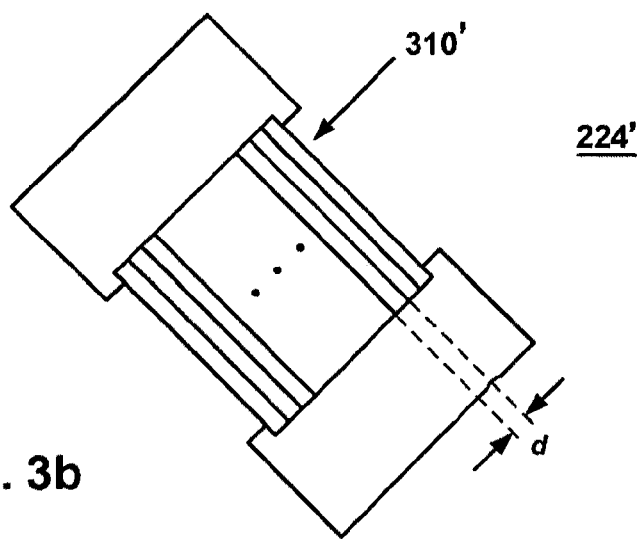
FIG. 3b is a plan view diagram of a field effect transistor that shows a model of the conduction channel divided into a plurality of discrete percolation channels.

Models have been developed to describe the conduction of electrons in percolation channels. Conduction occurs in atomic scale channel partitions. The size of each channel partition or width of each of the fractional channels is set to be determined by, a, the average spacing between electrons in the channel near the source, where $a^2$ is the average area occupied by a single electron. The bulk charge behind the channel will determine the threshold voltage of this portion of the channel as shown in FIGS. 3a and 3b. This threshold voltage can however vary due to the random location of ionized impurity atoms and dopant fluctuation behind the channel. If the substrate doping is high of the order $10^{17}/cm^3$ there will be about 1000 ionized acceptor dopant atoms with negative charge in the depletion region behind the channel. The six percolation, or river-like, conduction channels snake between the ionized acceptor atoms along the points of lowest potential. Trapping of a single electron in an oxide trap can cause a change in the local threshold voltage close to the source in any of the six channels by more than 10 mV and turn off any of the channel partitions 310, resulting in about a 16% change in drain current for the six channel partition example.

In FIG. 3b, when the gate voltage of the transistor 224' is relatively high (where the substrate-to-source junction voltage $V_J=V_{GS}-V_T=1.0V$ and the model channel partition width d=60 Å), the separation between individual electrons in the channel is small, and the model indicates many channel partitions 310'. Again there will be negative ionized impurity acceptor dopant atoms behind any particular channel partition and the percolation channel, or river-like channel, can snake around these. Trapping of a single electron in an oxide trap can cause a change in the local threshold voltage near the source in any particular channel of more than 1V and stop the conduction in any of the channel partitions each separately resulting in about a 1.6% change in drain current. In either of the above cases there is a finite and real possibility of the trapping of more than one electron at any given time resulting in complex RTS signals and larger changes than for the trapping of a single electron.

These changes in drain current are much larger than those predicted by a micron scale model where there is a uniform sheet of charge and average change in the overall threshold voltage as is conventionally employed. The larger RTS signals here are a direct consequence of the localized non-uniformities in conduction in the transistor channel near the source of the transistor. If a conventionally employed model with a uniform sheet of charge in the channel had been employed in FIG. 3a, where $V_{GS}-V_T=10$ mV, then the change in the average threshold voltage would be about 0.3 mV and the average change in drain current would be only about 3%. If a conventionally employed model is used with a uniform sheet of charge in the channel had been employed in FIG. 3b where $V_{GS}-V_T=1$ V, then the average change in threshold voltage would be about 0.3 mV and the average change in drain current would be only about 0.03%. These values are much smaller than those predicted by our model describing conduction in percolation channels, where the changes were 16% and 1.6%, respectively.

Figure 4:
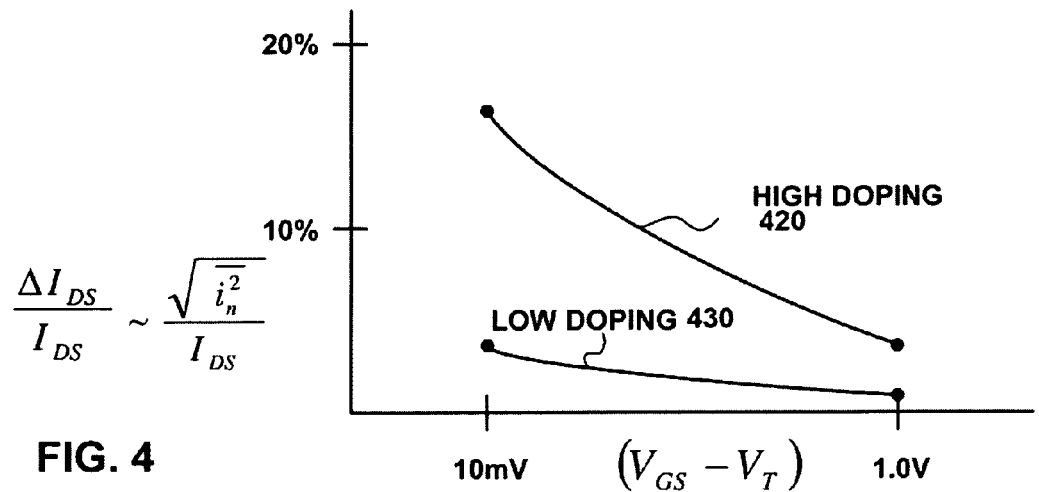
FIG. 4 is a graph that illustrates the fluctuations, or changes, in drain current with the trapping or emission of a single electron.

The graph of FIG. 4 shows two different gate voltages and the fluctuations possible in the drain current (vertical axis) of a transistor with two different substrate dopings 420 and 430. In one embodiment, the heavily doped channel 420 has about $10^{17}$ acceptors ions per cubic centimeter, or for the particular device geometry of 350 nm by 350 nm, about $10^{12}$ ionized boron acceptor impurities per square centimeter and about 1000 boron dopant atoms behind the channel. This large number of dopant atoms results in potential variations and percolation channels. In the case of a low doping 430, for example $10^{13}$ acceptor ions per cubic centimeter, or for the particular device geometry of 350 nm by 350 nm, $10^{10}$ ionized impurities per square centimeter, only 10 dopant atoms is expected behind the channel. These small number of ionized atoms in the surface space charge depletion region are not enough to cause significant potential variations in the channel. With low channel doping 430 and low threshold voltages the device channel can again be treated as a uniform sheet of charge and the changes in the drain current caused by the fluctuation of one electron in the gate insulator will be very small. Low RTS and 1/f noise is achieved by using a low number of dopant impurities in the substrate which results in a small number of ionized impurities in the depletion region behind the channel.

Techniques to Minimize RTS and Equivalently 1/f Noise

Low noise can then be achieved by using low doping in the substrate of the CMOS transistors to avoid localized potential variations in the channel. This results in MOS transistors with a lower threshold voltage, but the threshold voltage is also conventionally determined by other factors like gate materials and gate material work functions. This can also be achieved by using forward substrate bias that narrows the surface depletion region also resulting in fewer doping atoms in the depletion region. Forward substrate bias also results in lower threshold voltages, which threshold voltage is also conventionally determined by other factors like gate materials and gate material work functions.

The large devices examined in a previous comparison of P-channel and N-channel transistors used a W/L proportion of 100 μm/32 μm, where the effects of size were not readily observable, in contrast to the technology, devices, and techniques described herein that are applicable to sub-micron dimension devices, specifically those with dimensions less than about 350 nm, and preferably less than 100 nm.

Figure 5:
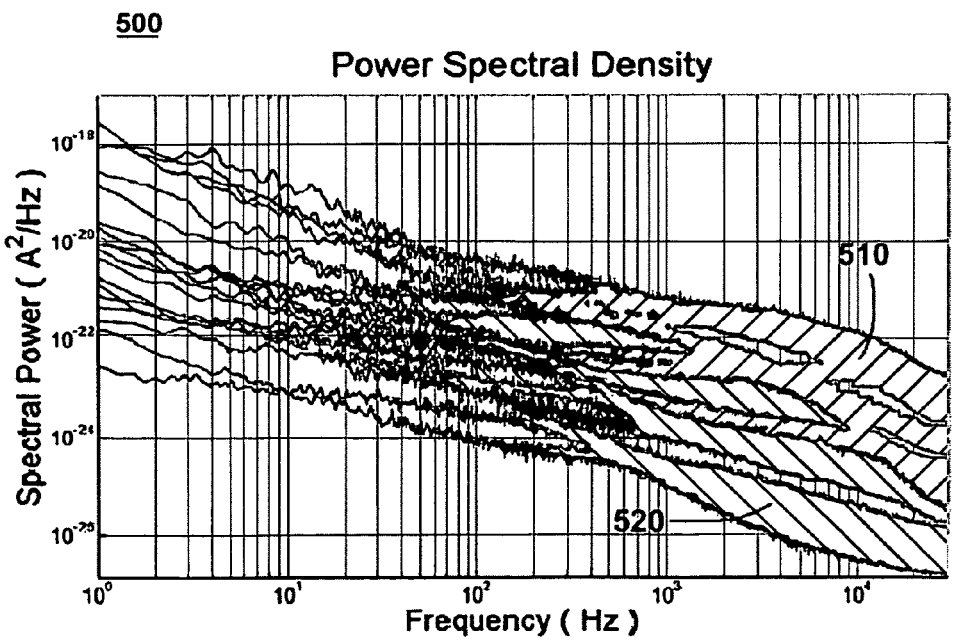
FIG. 5 is a graph that shows the effect of a low doping of ionized impurities behind the channel of a transistor on RTS noise or equivalently 1/f noise.

The power spectral density graph 500 of FIG. 5 shows the measured low 1/f and RTS noise observed in devices with lower doping, lighter curves 520, and lower threshold voltages. Higher dopings are shown in darker curves curves 510. Devices with lower substrate doping 520 have lower threshold voltages and lower noise.

Low doping and low threshold voltages are also consistent with the requirement to get more overdrive in MOS integrated circuits. It does however require very small or even negative gate to source voltages to turn the devices off; this may require some changes in power supply voltages and circuit designs. Low doping has been used previously to achieve low threshold voltages in micrometer size devices but have not been described to minimize noise in nanometer size devices. Forward substrate bias has been used previously to achieve low threshold voltages in micrometer size devices but has not been described to minimize noise in nanometer size devices. Forward substrate bias results in lower noise and allows a larger excess of gate voltage above the threshold voltage or more overdrive. Low doping for MOSFET devices of nanometer dimensions, i.e., W/L of less than 1000 nm and preferably less than 350 nm, means a concentration of dopant atoms in the range of $10^{13}$ to $10^{15}$ atoms per cubic centimeter and preferably about $10^{15}$ atoms per cubic centimeter. Further the substrate-to-source junction forward bias ($V_{GS}-V_T$) for reduced RTS noise is set in the range of 0.3V to 1.0V, and preferably 0.5V.

Figure 6:
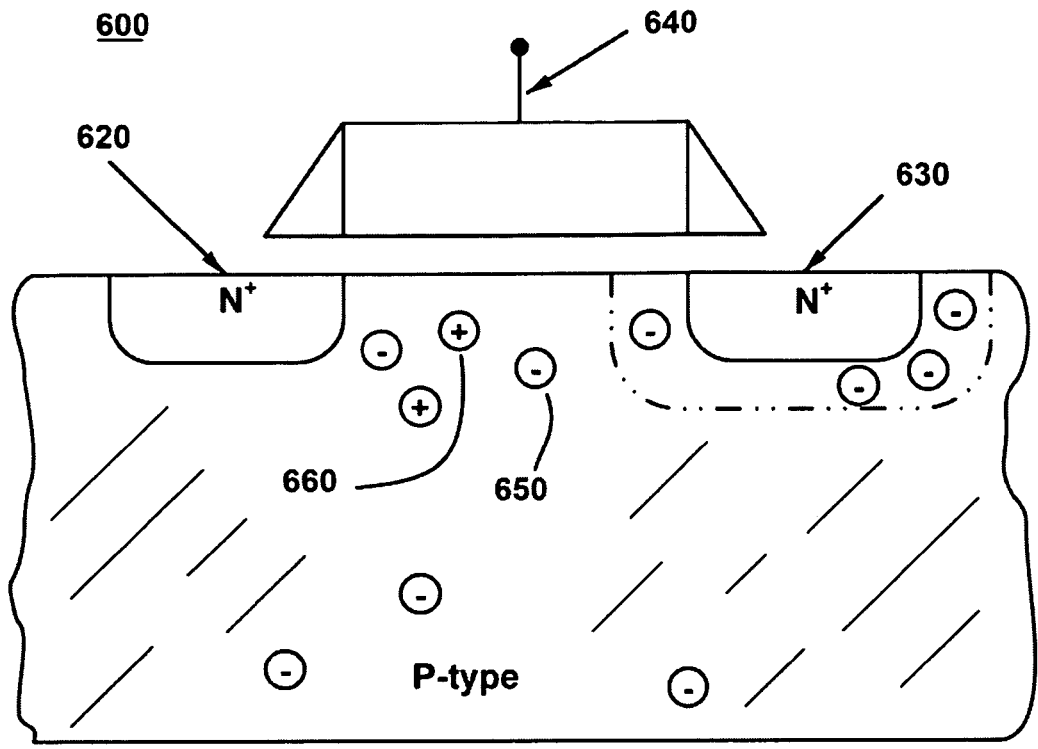
FIG. 6 is a sectional diagram that illustrates one embodiment of a planar field effect transistor with a low concentration of ionized impurities behind the channel.

FIG. 6 shows one embodiment of the techniques described herein to achieve low RTS and equivalently low 1/f noise. A planar NMOS transistor 600 that may be in CMOS configuration is fabricated on a substrate with very low doping of $10^{15}$ atoms per cubic centimeter resulting in a very low concentration of ionized acceptor impurity atoms 650. A range of values from $10^{13}$ to $10^{15}$ atoms per cubic centimeter is preferred. The transistor has conventional source 620, drain 630, and gate 640 structures. The effective substrate doping can be made even lower by counter doping with donor type impurities 660. The low substrate, or low effective substrate, doping results in few potential peaks in the channel and fewer percolation channels and consequently lower RTS noise. PMOS transistors normally employ counter doping to control the threshold voltage and are typically observed to be lower noise devices. Conventional NMOS devices have conventionally employed higher dopings of boron atoms to make the transistor threshold voltage more positive and the transistors enhancement mode devices. Conventional NMOS transistors have been observed to have a higher noise than PMOS transistors.

Figure 7A:
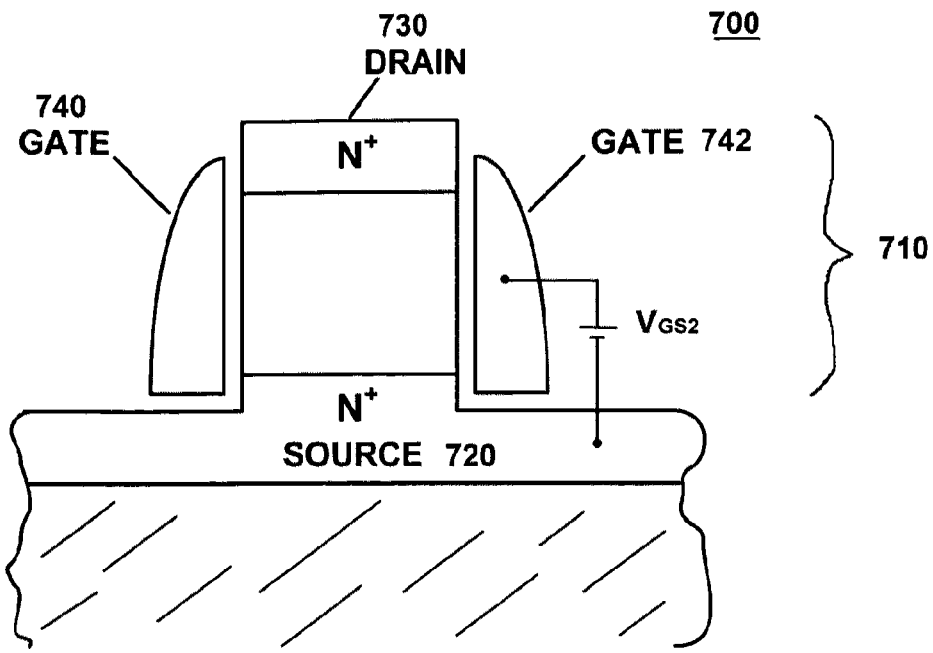
FIG. 7a is a sectional diagram that illustrates an alternative embodiment a dual gate vertical transistor with a very low net concentration of ionized impurities behind the channel.
Figure 7B:
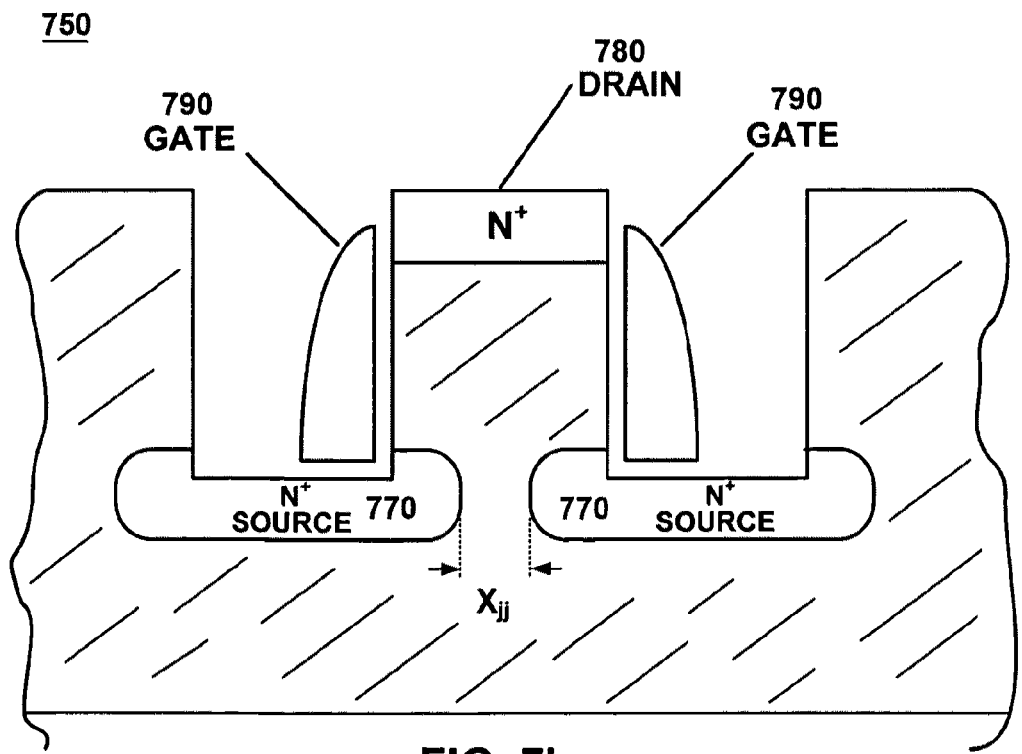
FIG. 7b is a sectional diagram that illustrates an alternative embodiment of the dual gate vertical transistor with a different structure for the source of the transistor.

FIGS. 7a and 7b show the implementation of these techniques in three dimensional, 3D, transistors and in this case vertical MOSFET transistors. The vertical transistor 700 in FIG. 7a has source 720, a vertical body region with drain 730 and vertical gate 740, 742 structures. If the body region has a low doping in the range from $10^{13}$ to $10^{15}$ atoms per cubic centimeter then the threshold voltage of the gate 740 on one side of the body can be controlled by the bias, $V_{GS2}$, on the gate 742 of the transistor on the other side of the body. In one embodiment of the present invention, this gate bias is adjusted to be in the range of 0.0V to 5.0V. The alternative vertical transistor structure 750 in FIG. 7b has source regions 770, a vertical body region with drain 780 and vertical gate 790 structures. The distance between the source regions 760, $x_{ij}$, must be small, one micrometer or less. Again if the body doping is small there will be few ionized impurities in the vertical body structure and the threshold voltage of the gates can be made independent of the body doping. If there are few ionized impurities there will be no percolation channels and low noise. In the case of vertical structures it would be easy to achieve a low noise independent of the threshold voltages.

Figure 8:
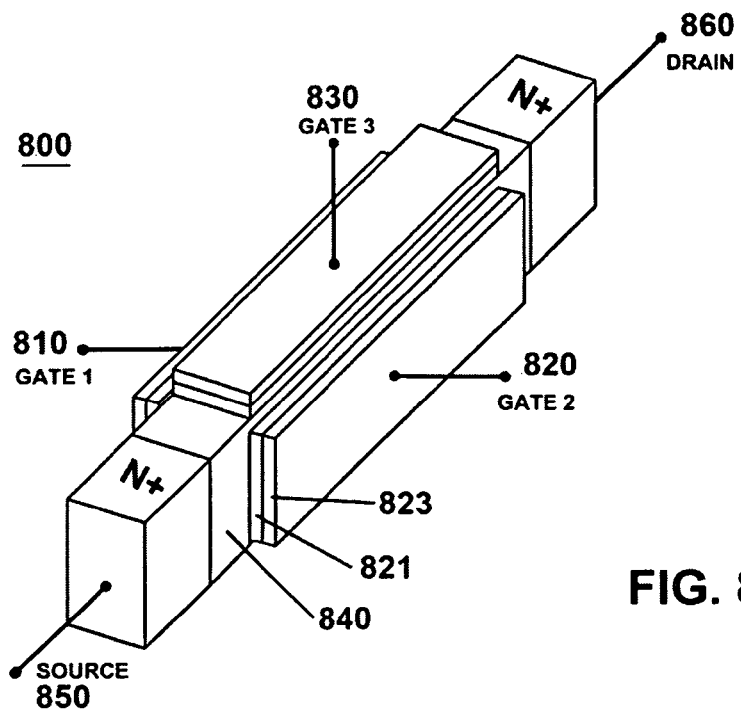
FIG. 8 is a perspective diagram that illustrates an alternative embodiment of consisting of a FINFET CMOS transistor structure with three gates, or a tri-gate structure.

FIG. 8 shows the implementation of these techniques in a three dimensional, 3D, transistor structure 800 and in this case a FINFET transistor with three gates, a tri-gate structure. There are three gates, 810, 820, and 830 on the sides and top of a thin fin 840 of silicon. These gate structures comprising a gate insulator 821 and conductive gate layer 823 and can be driven at different voltages, or some or all may be driven at the same gate voltage potential. The source 850 and drain 860 are disposed on the ends of the fin. Again the fin is very lightly, in the range from $10^{13}$ to $10^{15}$ atoms per cubic centimeter, doped and one of the gates on one of the sides can be used to control the threshold voltage and conduction on the other side of the fin. With a lightly doped fin substrate or forward substrate bias, the conduction can be deemed a sheet of charge without any percolation channels and minimal RTS and 1/f low frequency noise.

Low noise is achieved by using low doping in the substrate (that is, fins or pillars) of the CMOS transistors to avoid localized potential variations in the channel. The technique described is the use of a low doping and low concentration of ionized impurities in the space charge region behind the channel. Ion implantation has been used previously for p-channel counterdoping but such technology resulted in higher noise in n-channel devices. The technique employed presently is uniquely different in that a low doping is used from the start; by the use of lightly doped substrates, doped in the range from $10^{13}$ to $10^{15}$ atoms per cubic centimeter, there is neither additional ion implantation nor ion implantation for counter doping. Moreover, low noise can also be achieved by using forward substrate bias that narrows the surface depletion region also resulting in fewer dopant atoms in the depletion region on devices with wells or substrates.

Some types of silicon integrated circuits do not have any particular need or restriction on power consumption as such they tend to and can use higher power supply voltages. The circuits are RF, wireless, analog integrated circuits, and some types of sensors. A lower doping behind the channel results in a lower threshold voltage for N-channel transistors and a lower magnitude of the threshold or turn on voltage for P-channel transistors. In most cases this will benefit circuit operation, if not it can be accommodated by circuit design changes or changes in the gate material and work functions of the gate material.

CMOS active pixel sensor (APS) imagers also benefit by having one or more transistors with a lower threshold voltage in the pixel, resulting in a larger output swing. However, such a larger output swing and larger dynamic range is only beneficial in so far as the pixel has lower noise. A lower, in the range from $10^{13}$ to $10^{15}$ atoms per cubic centimeter, doping behind the channel results in a lower threshold voltage, less noise and as a secondary benefit wider dynamic range.

Historically, adjustment of threshold voltages was done by ion implantation, but different gate materials with different work functions may also be used. Low doping behind the channels in digital integrated circuits, for instance memories and processors, results in not only reduced noise and lower error rates but also threshold voltages with smaller magnitudes. This is beneficial in that lower power supply voltages can be used resulting in lower power dissipation, a critical concern in digital circuits. If the lowered threshold voltages result in excessive standby or sub-threshold leakage currents, the threshold voltages can be adjusted by changing gate materials or employing different circuit designs. The primary advantage of lower doping is lower noise and lower error rates a secondary consequence may be lower power consumption.

The technique of using lower substrate, well, pillar, or fin doping to lower RTS or 1/f noise in CMOS devices were developed as a consequence of the discovery by the inventors that RTS or 1/f noise was a consequence of conduction in percolation, or river-like, channels in sub-micron, or nanoscale, devices. This noise effect became more apparent as a consequence of the fact that conventional sub-micron CMOS devices were being made with higher substrate dopings as the industry progressed to nanoscale devices. This manufacturing trajectory of higher dopings resulted in conduction in percolation channels rather than as a sheet of charge, which was the conventional characterization of previous nanoscale (micron-sized) devices. Having discovered this effect and being able to describe it in terms of a qualitative model then allowed the development of techniques to minimize RTS and 1/f noise in nanometer size transistors, namely the use of lower substrate dopings. Other techniques such as different gate insulators and gate materials can be used to control the threshold voltages, or gate and circuit voltages can be adjusted to accommodate the different threshold voltages. In vertical pillar type or fin type transistors the threshold voltage can be conveniently controlled independently of the threshold voltage by a fixed bias on one of the gates.

What is claimed is:

1. A method of reducing random telegraph signal (RTS) and 1/f noise in active silicon FINFET MOS field effect devices, comprising the operations of: defining an active silicon FINFET MOS field effect device on a substrate, said active silicon FINFET MOS field effect device having a width dimension equal to or less than 350 nm and a length dimension equal to or less than 350 nm; and doping the conduction channel behind the gate electrode of said active silicon FINFET MOS field effect device to an ionized dopant atom concentration in the range of 10^13 to 10^15 atoms per cubic centimeter.

2. The method of claim 1 further comprising applying a forward bias the substrate-to-source junction of the active silicon FINFET MOS field effect device by a magnitude in the range of 0.3V to 0.7V.

3. The method of claim 2 wherein said applying a forward bias the substrate-to-source junction further comprises applying a forward bias of substantially 0.5V.

4. The method of claim 2 further comprising determining and setting the magnitude of $V_{GS}$-$V_T$ independently of a value of $V_T$.

5. The method of claim 1 wherein the active silicon FINFET MOS field effect device is one of an N-channel MOS transistor and a P-channel MOS transistor.

6. The method of claim 1 wherein said ionized dopant atoms are one of boron atoms and phosphorus atoms.

7. The method of claim 1 wherein the active silicon FINFET MOS field effect device is one of a vertical pillar MOS device and a fin-type MOS device.

8. The method of claim 7 further comprising biasing one gate of a plurality of gates to a magnitude of potential in the range of 0.0V and 5.0V.

9. A method of reducing random telegraph signal (RTS) and 1/f noise in active silicon FINFET MOS field effect devices of nanometer size having as plurality of gates, comprising the operations of: applying a forward bias to the substrate-to-source junction of the active silicon FINFET MOS field effect device by a magnitude of potential in the range of 0.3V to 0.7V; and applying a bias to one gate electrode of the plurality of gates of the active silicon FINFET MOS field effect device to a magnitude of potential in the range of 0.0V and 5.0V.

10. The method of claim 9 further comprising doping the conduction channel behind the gate electrode of the active silicon FINFET MOS field effect device to an ionized dopant atom concentration in the range of 10^13 to 10^15 atoms per cubic centimeter.

11. The method of claim 9 wherein said applying a forward bias to the substrate-to-source junction further comprises applying a forward bias of substantially 0.5V.

12. The method of claim 9 further comprising determining and setting the magnitude of the gate-to-source bias, $V_{GS}$-$V_T$, independently of a value of $V_T$.

13. The method of claim 9 wherein the active silicon FINFET MOS field effect device is one of an N-channel MOS transistor and a P-channel MOS transistor.

14. The method of claim 10 wherein said ionized dopant atoms are one of boron atoms and phosphorus atoms.

15. The method of claim 9 wherein the active silicon FINFET MOS field effect device is one of a vertical pillar MOS transistor and a fin-type MOS transistor.

16. An active silicon FINFET MOS field effect transistor apparatus having a width dimension equal to or less than 350 nm and a length dimension equal to or less than 350 nm and reduced random telegraph signal (RTS) and 1/f noise, the apparatus comprising: a conduction channel behind a gate electrode of the active silicon FINFET MOS field effect transistor doped to an ionized dopant atom concentration in the range of $10^{13}$ to $10^{15}$ atoms per cubic centimeter; and a substrate-to-source junction forward bias of a magnitude of potential in the range of 0.3V to 0.7V.

17. The apparatus of claim 16 wherein the active silicon FINFET MOS field effect transistor is one of an active pixel sensor, an imager, a digital integrated circuit of low error rate, a memory element of low error rate, a memory sense amplifier, and an analog integrated circuit of low offset voltage error.

18. The apparatus of claim 16 wherein said ionized dopant atoms are one of boron atoms and phosphorus atoms.

19. The apparatus of claim 18 wherein the active silicon FINFET MOS field effect transistor is one of a vertical pillar MOS transistor and a fin-type MOS transistor.

20. The apparatus of claim 16 further comprising a bias of one gate of a plurality of gates of the active silicon FINFET MOS field effect transistor to a magnitude of potential in the range of 0.0V and 5.0V.

* * * * *